United States Patent
Stebani et al.

(10) Patent No.: US 9,789,679 B2
(45) Date of Patent: *Oct. 17, 2017

(54) DIGITALLY EXPOSABLE FLEXOGRAPHIC PRINTING ELEMENT AND METHOD FOR PRODUCING FLEXOGRAPHIC PRINTING PLATES

(71) Applicant: Flint Group Germany GmbH, Stuttgart (DE)

(72) Inventors: Uwe Stebani, Flörsheim-Dalsheim (DE); Armin Becker, Großniedesheim (DE); Matthias Beyer, Pfinztal (DE); Denis Riewe, Willstätt (DE); Andreas Reifschneider, Mannheim (DE)

(73) Assignee: Flint Group Germany GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/022,660

(22) PCT Filed: Sep. 18, 2014

(86) PCT No.: PCT/EP2014/069853
§ 371 (c)(1),
(2) Date: Mar. 17, 2016

(87) PCT Pub. No.: WO2015/040094
PCT Pub. Date: Mar. 26, 2015

(65) Prior Publication Data
US 2016/0229172 A1 Aug. 11, 2016

(30) Foreign Application Priority Data
Sep. 18, 2013 (EP) .................................. 13185009

(51) Int. Cl.
G03F 7/40 (2006.01)
B41C 1/00 (2006.01)
G03F 7/09 (2006.01)
G03F 7/20 (2006.01)
G03F 7/30 (2006.01)

(52) U.S. Cl.
CPC .............. B41C 1/006 (2013.01); G03F 7/092 (2013.01); G03F 7/202 (2013.01); G03F 7/3057 (2013.01)

(58) Field of Classification Search
CPC ....................................................... G03F 7/40
See application file for complete search history.

(56) References Cited

U.S. PATENT DOCUMENTS

| | | | |
|---|---|---|---|
| 4,722,355 A * | 2/1988 | Moe | G03F 7/422 134/103.2 |
| 5,061,606 A | 10/1991 | Telser et al. | |
| 5,262,275 A | 11/1993 | Fan | |
| 8,492,074 B2 | 7/2013 | Bryant | |
| 2004/0081908 A1 | 4/2004 | Shimazu et al. | |
| 2010/0311247 A1 | 12/2010 | Kappler | |
| 2011/0023739 A1 | 2/2011 | Yoshimoto | |
| 2012/0097188 A1 | 4/2012 | Kappler et al. | |
| 2012/0164584 A1 | 6/2012 | Recchia | |
| 2012/0214102 A1 | 8/2012 | Recchia et al. | |
| 2012/0270156 A1 | 10/2012 | Vest et al. | |
| 2013/0242276 A1 | 9/2013 | Schadebrodt et al. | |

FOREIGN PATENT DOCUMENTS

| | | | | |
|---|---|---|---|---|
| DE | 2820815 A1 | 11/1979 | | |
| DE | 102007063169 A1 | 6/2009 | | |
| DE | 102007063202 A1 | 6/2009 | | |
| DE | 102009032217 A1 | 1/2011 | | |
| EP | 332070 A2 | 9/1989 | | |
| EP | 0697967 A1 | 2/1996 | | |
| EP | 1069475 A1 | 1/2001 | | |
| EP | 1156368 A2 | 11/2001 | | |
| EP | 2 128 702 A1 | 12/2009 | | |
| EP | 2284612 A1 | 2/2011 | | |
| JP | EP 1156368 A2 * | 11/2001 | ............ | G03F 7/202 |
| WO | WO-9426533 A1 | 11/1994 | | |
| WO | WO-2005/101130 A1 | 10/2005 | | |
| WO | WO-2008135865 A2 | 11/2008 | | |
| WO | WO-2011041046 A1 | 4/2011 | | |
| WO | WO-2012/010459 A1 | 1/2012 | | |
| WO | WO-2012/145111 A1 | 10/2012 | | |
| WO | WO-2015007667 A1 | 1/2015 | | |

OTHER PUBLICATIONS

International Search Report for PCT/EP2014/069853 mailed May 7, 2015.
International Preliminary Report on Patentability for PCT/EP2014/069853 mailed Sep. 10, 2015.
International Search Report for PCT/EP2014/062194 mailed Sep. 8, 2014.

\* cited by examiner

*Primary Examiner* — Chanceity Robinson
(74) *Attorney, Agent, or Firm* — Drinker Biddle & Reath LLP

(57) ABSTRACT

Digitally imagable flexographic printing elements for producing flexographic printing plates, which comprise an organically soluble relief-forming layer, a water-soluble barrier layer for oxygen, and a water-soluble laser-ablatable mask layer. A method for producing flexographic printing plates using such flexographic printing elements, which comprises a two-stage washout procedure using aqueous and organic washout media.

18 Claims, 5 Drawing Sheets

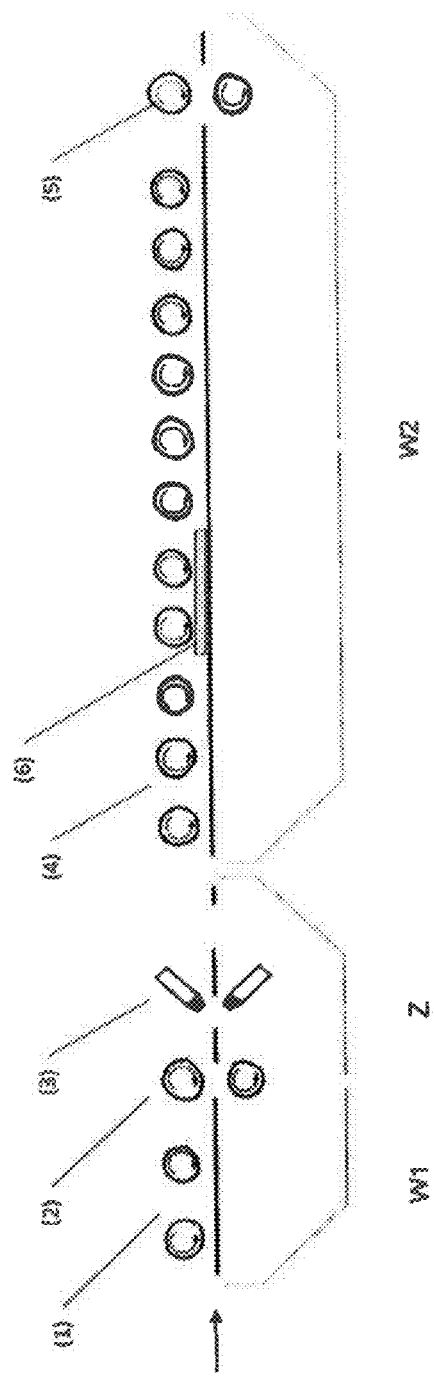
Figure 1: Diagrammatic representation of a two-zone washer

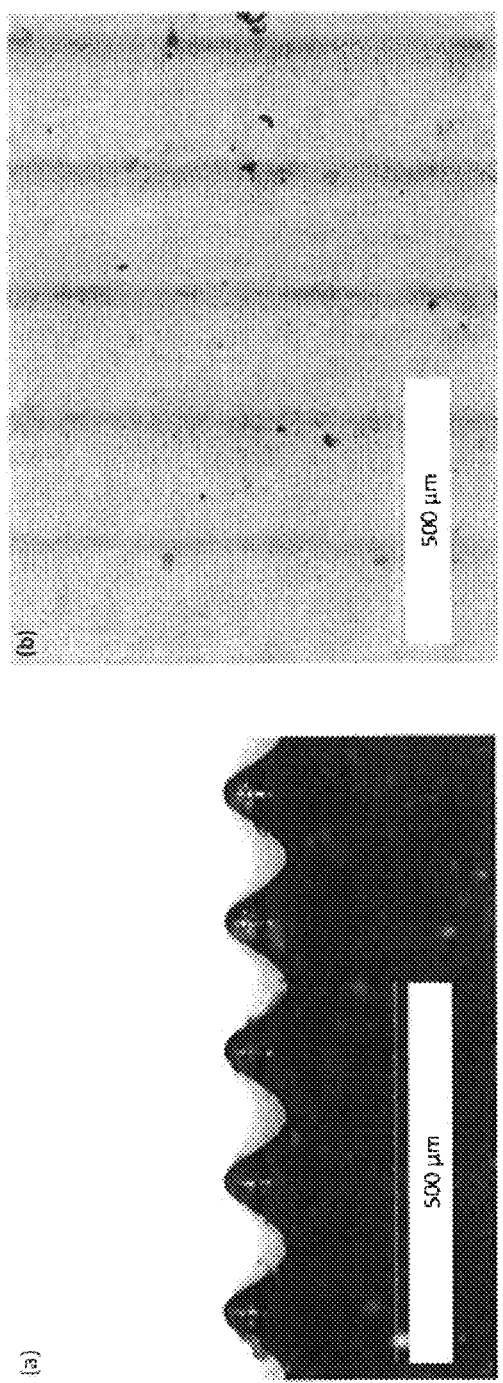
Fig. 2: Microscope images of the flexo plate of comparative example 1 (a) cross section with clearly visible rounded dots and (b) plan view: a surface pattern can be observed only roughly.

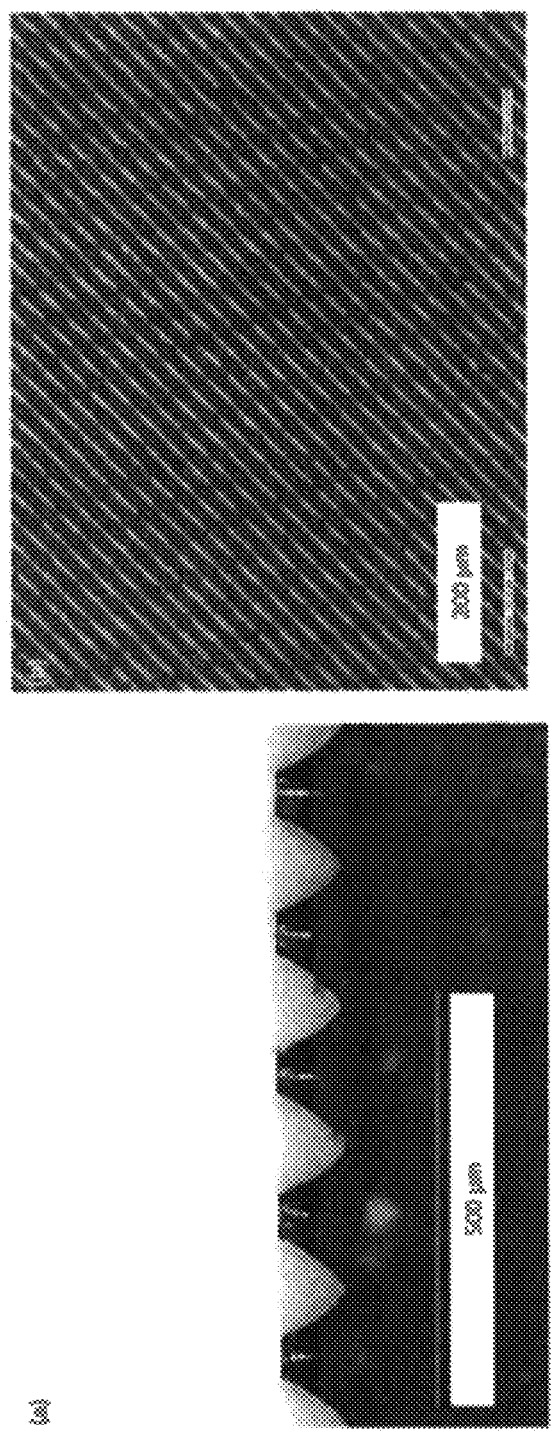

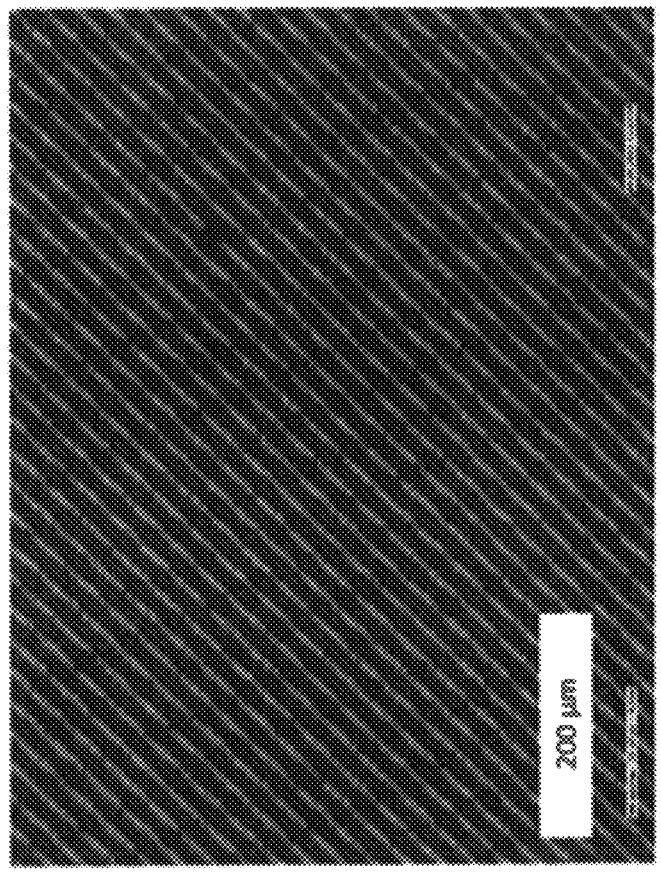
Fig. 4: Microscope images of the flexo plate described from inventive example 2.
Plan view of the MG25 halftone field. The halftone pattern is imaged with accurate detailing on the printing plate. The flexographic printing element was imaged with an energy of 1.7 J/cm².

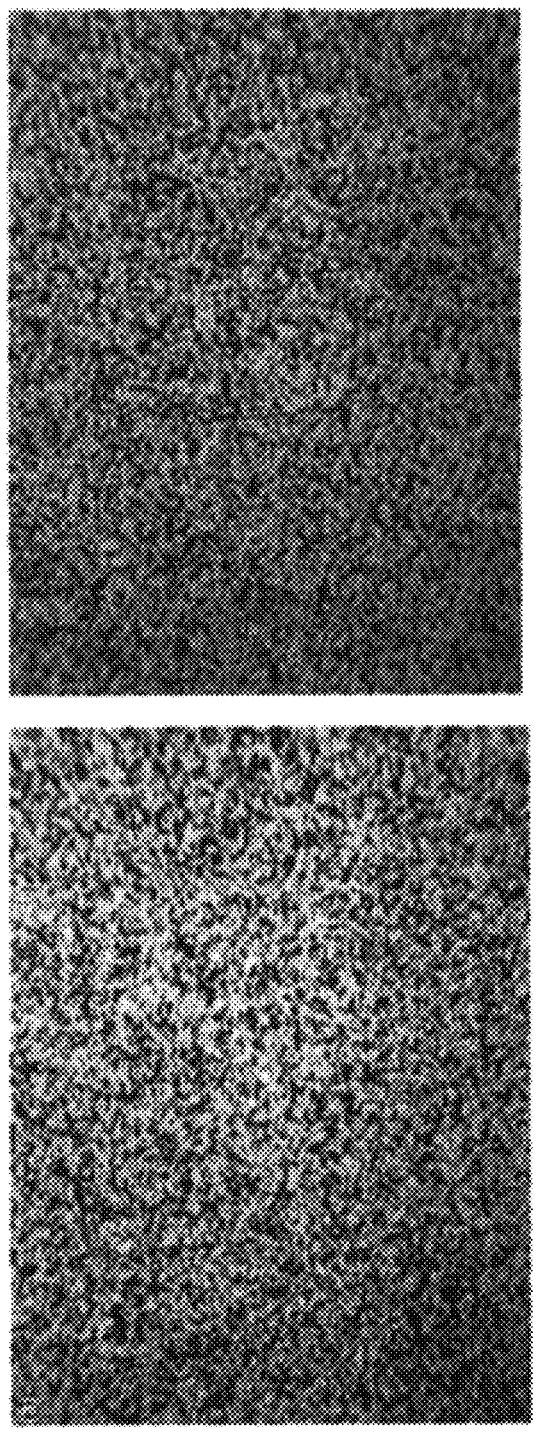
Fig. 5 Microscope images of the surfaces from inventive example 4. (a) plan view of the barrier layer with filler on PET support sheet and (b) plan view of the rough flexo plate. The roughness can be transferred directly to the plate. The flexographic printing element was imaged with an energy of 1.7 J/cm².

DIGITALLY EXPOSABLE FLEXOGRAPHIC PRINTING ELEMENT AND METHOD FOR PRODUCING FLEXOGRAPHIC PRINTING PLATES

CROSS-REFERENCE TO RELATED APPLICATIONS

This application is a national stage application (under 35 U.S.C. §371) of PCT/EP2014/069853, filed Sep. 18, 2014, which claims benefit of European Application No. 13185009.1, filed Sep. 18, 2013, both of which are incorporated herein by reference in their entirety.

The present invention relates to digitally imagable flexographic printing elements for producing flexographic printing plates, comprising an organically soluble, relief-forming layer, a water-soluble barrier layer for oxygen, and a water-soluble, laser-ablatable mask layer. The invention further relates to a method for producing flexographic printing plates using such flexographic printing elements, which comprises a two-stage washout procedure using aqueous and organic washout media.

Digitally imagable flexographic printing elements are known in principle. They comprise at least a dimensionally stable support, a photopolymerizable layer, and a digitally imagable layer. The digitally imagable layer may for example be a laser-ablatable layer, a layer which can be written using inkjet printers, or a thermographic layer; laser-ablatable layers are the most commonplace.

Laser-ablatable layers, also called LAMS (laser-ablatable mask system) layers, are opaque for the wavelength of actinic light and customarily comprise a binder and also at least one IR absorber such as carbon black, for example. Carbon black also makes the layer opaque. Using an IR laser, a mask can be written into the laser-ablatable layer; in other words, at the locations at which it is struck by the laser beam, the layer is decomposed and the photopolymerizable layer beneath it is revealed. The laser-ablatable mask layer may be applied directly to the photopolymerizable layer, or else between the photopolymerizable layer and the laser-ablatable mask layer there may be further layers, such as a barrier layer. Examples of the imaging of flexographic printing elements with IR-ablative masks are disclosed in U.S. Pat. No. 5,262,275 or EP-A 1 069 475, for example.

Starting from photopolymerizable, digitally imagable flexographic printing elements, flexographic printing plates are produced as follows: After a mask has been written into the digitally imagable layer, the flexographic printing element is exposed through the mask with UV radiation or UV/VIS radiation. In the regions no longer concealed by the mask, the photopolymerizable layer undergoes polymerization, while in the concealed regions there is no polymerization. Following exposure, the residues of the mask and also the unpolymerized fractions of the photopolymerizable layer are removed. This can be done using one or more solvents or else thermally. If using solvents, there is a subsequent drying step, and the resulting flexographic printing plate is customarily also aftertreated, by exposure with UVA and/or UVC light, for example.

In the case of digitally imagable flexographic printing elements, the main exposure takes place by means of UV or UV/VIS radiation, customarily in the presence of atmospheric oxygen.

The presence of oxygen at main exposure is known to have a very considerable influence on the form of the printing relief elements, especially on the form of fine halftone elements. Molecular oxygen, as is known, is a diradical and is therefore able to react with other radicals. As a result of the presence of molecular oxygen during the UV-light-initiated radical polymerization, the oxygen interrupts the radical chain reaction on the surface of the photopolymerizable layer, with the consequence that the surface of the relief element is no longer adequately polymerized. Regions of the photopolymerizable layer that are situated further beneath the surface are less affected. In the course of the development of the layer after the polymerization, the layers which have not been sufficiently polymerized are likewise removed. The relief elements are therefore smaller than they actually ought to be, and have rounded corners. This effect is illustrated in EP 2 128 702 A1, page 15, FIG. 1, for instance.

The disruptive influence of oxygen during the exposure of the flexographic printing elements ought fundamentally to be ruled out, so that the intended relief elements are polymerized fully through to the surface and hence relatively fine details on the plate can be imaged and very fine structures can be imaged in solid areas. This serves in particular for improving ink transfer and ink lay.

Proposals have therefore been made to protect the photopolymerizable layer from oxygen during the main exposure.

It is possible in principle to carry out exposure under inert gas or using a vacuum frame, though such a procedure entails additional apparatus expense and/or complexity, and is therefore usually avoided.

Proposals have also been made to protect the photopolymerizable layer in flexographic printing elements from atmospheric oxygen by means of additional barrier layers. Such barrier layers are intended to prevent or at least minimize the diffusion of oxygen into the photopolymerizable layer.

U.S. Pat. No. 5,262,275 discloses flexographic printing elements for producing flexographic printing plates, comprising a support, a photopolymerizable layer, a barrier layer applied thereon, and a laser-ablatable mask layer applied thereon. The barrier layer is intended on the one hand to prevent the migration of components, such as of monomers, from the photopolymerizable layer into the laser-ablatable layer, and on the other hand to protect the photopolymerizable layer from atmospheric oxygen during exposure of the flexographic printing element. Both photopolymerizable and nonphotopolymerizable barrier layers are proposed. Materials proposed for nonphotopolymerizable barrier layers include both water-soluble binders and binders that are soluble in organic binders, such binders being polyamides, polyvinyl alcohol, hydroxyalkylcellulose, ethylene-vinyl acetate copolymers, amphoteric interpolymers, and combinations thereof. The thickness of the barrier layer is 0.25 µm to 76 µm, preferably 0.38 to 64 µm.

WO 2012/145111 A1 discloses photopolymerizable flexographic printing elements, for producing flexographic printing plates, comprising a support, a photopolymerizable layer, a barrier layer applied thereon, and a laser-ablatable layer applied thereon. The barrier layer has a diffusion coefficient for $O_2$ of less than $6.9*10^{-9}$ $m^2/s$ and an optical transparency of at least 50%, preferably at least 75%. The thickness of the barrier layer is 1 to 100 µm, preferably 1 to 20 µm. Materials proposed for the barrier layer include both water-soluble binders and binders that are soluble in organic binders, such binders being polyamides, polyvinyl alcohol, hydroxyalkylcellulose, polyvinylpyrrolidone, ethylene-vinyl acetate copolymers, amphoteric interpolymers, cellulose acetate butyrate, alkylcellulose, butyral, cyclic rubbers, or combinations thereof.

US 2012/0164584 A1 discloses a method for producing flexographic printing plates using a digitally imagable flexographic printing element which has a laser-ablatable layer. After a mask has been written into the laser-ablatable layer, a barrier layer is applied to the upper face of the flexographic printing element, meaning that it covers not only the exposed areas of the photopolymerizable layer but also those regions of the laser-ablatable layer itself that are still present. This is followed by exposure to UV light. Materials proposed for the barrier layer include both water-soluble binders and binders that are soluble in organic solvents, such binders being polyamides, polyvinyl alcohol, hydroxyalkylcellulose, polyvinylpyrrolidone, ethylene-vinyl acetate copolymers, amphoteric interpolymers, cellulose acetate butyrate, alkylcellulose, butyral, cyclic rubbers, or combinations thereof. Oils are a further option. The thickness of the barrier layer is 1 to 100 μm, preferably 1 to 20 μm. The application of the barrier layer signifies an additional method step between imaging and exposure, and therefore additional cost and complexity.

U.S. Pat. No. 8,492,074 B2 discloses a method for producing flexographic printing plates using a digitally imagable flexographic printing element which has a laser-ablatable layer. Here as well, after a mask has been written into the laser-ablatable layer, a barrier layer is applied to the facing side of the flexographic printing element, and therefore covers not only the revealed locations on the photopolymerizable layer but also the regions of the laser-ablatable layer itself that are still present. This is followed by UV light exposure. The barrier layer comprises at least two different resins, the resins being selected preferably from the group of polyvinylpyrrolidone, shellac, polyvinyl butyral, polyvinylidene chloride, or vinyl chloride copolymers. The diffusion coefficient for $O_2$ of the barrier layer is preferably less than $6.9*10^{-9}$ m$^2$/s. U.S. Pat. No. 8,492,074 B2 further discloses the possibility of there being an applied barrier layer of this kind between the photopolymerizable layer and the laser-ablatable mask layer as well.

EP 2 284 612 A1 discloses digitally imagable flexographic printing elements comprising a support, a water-developable photopolymerizable layer, an oxygen barrier layer with a thickness of 0.2 μm to 2 μm, and a heat-sensitive mask layer which can be written by means of a laser and which has a thickness of 0.5 μm to 5 μm. After a mask has been written into the heat-sensitive layer and after imagewise exposure has taken place, the exposed flexographic printing element is developed in a single-stage operation using aqueous washout media. The oxygen barrier layer may be water-soluble or else not. Layers which are not water-soluble are removed mechanically by the brushes of the washout equipment. The binder in the heat-sensitive layer as well may be either water-soluble or else not water-soluble.

WO 2005/101130 A1 discloses a multilayer mask film for producing flexographic printing plates. The mask film comprises a support, an IR-sensitive layer, an IR-ablative layer for example, and also, optionally, further layers, such as a barrier layer or a release layer, for instance. The mask film can be imaged with a laser, and is subsequently laminated onto a photopolymerizable flexographic printing element, with the support layer of the mask film forming the uppermost layer. The mask layer assembly is subsequently exposed over its whole area, with the option of exposure through the support layer or of removal of the support layer prior to exposure. Following exposure, the support film (if not already removed) can be removed either with or without the mask layer proper, and the exposed flexographic printing element can be developed conventionally.

Laminating processes such as the subsequent application of an oxygen-blocking film or the subsequent application of a previously exposed mask film are inadvisable, since defects may arise during each lamination, as a result of inclusion of dust particles or inclusion of air, for example. Any defect, however small, renders the flexographic plate unusable, however. Furthermore, laminating or the subsequent application of barrier layers are an additional workstep in the processing of the flexographic printing element, and are therefore extremely undesirable from the user standpoint.

In the prior art, furthermore, there are specialty exposure techniques known, from WO 2012/010459 A1 or WO 2008/135865 A2, for example, in which the flexographic printing elements are exposed using intensive UVA-LED radiation. The high energy of the exposure and the rapid polymerization that ensues minimize the effect of disruptive oxygen, and even fine surface structures on the flexographic printing plates can be imaged. The exposure apparatus, however, is much more expensive than standard commercial UVA tube exposure units. Furthermore, the imaging of One details necessitates relatively long exposure times, so further hindering the acceptance of this technology within the market.

Customary, digitally imagable flexographic printing elements with barrier layer in accordance with the prior art generally comprise a photopolymerizable, relief-forming layer which is soluble in organic washout media. The exposed flexographic printing elements are washed out generally in one step with organic solvent mixtures, where the residues of the digitally imagable layer, the barrier layer, and the unpolymerized fractions of the relief-forming layer are removed. The main component of the washout media used generally comprises apolar hydrocarbons as solvents, and one or more moderately polar alcohols as cosolvents. The purpose of adding alcohol is to dissolve somewhat more polar components of the barrier layer and of the laser-ablatable layer, as well.

In ongoing operation, owing to the higher volatility of the alcohols by comparison with that of the hydrocarbons, there is a change in the composition of the washout medium, to the detriment of the quality of the washout result. It is therefore necessary for the composition of the washout solution to be monitored continually. When the washout solution is spent and is regenerated by distillation, the composition must be formulated anew. Furthermore, the odor of the washout solutions as a general rule is unpleasant, caused primarily by the moderately polar alcohol. During operation of the washout equipment, moreover, there is a gradual soiling caused by carbon black from the laser-ablatable mask layer, the consequence of this being frequent equipment cleaning. It is extremely desirable to have a washout procedure available which uses only hydrocarbon washout media and requires little maintenance effort and cost.

It was an object of the invention to produce digitally imagable flexographic printing elements which offer high resolution, high tonal value range, and the possibility of surface structuring, and which can be processed easily and in a short time into a flexographic printing plate.

Surprisingly it has been found that the stated requirements can be met if in a digitally imagable flexographic printing element, a photopolymerizable layer which is soluble in organic solvents or solvent mixtures is combined with a water-soluble barrier layer and a water-soluble LAMS layer, and the exposed flexographic printing element is washed out by means of a two-stage procedure.

Found accordingly have been digitally imagable, photopolymerizable flexographic printing elements for producing flexographic printing plates, which comprise at least—arranged one above another in the order stated—
- (A) a dimensionally stable support,
- (B) at least one photopolymerizable relief-forming layer which is dispersible or soluble in organic solvents and has a layer thickness of 300 µm to 6000 µm, comprising at least one elastomeric binder, an ethylenically unsaturated monomer, and a photoinitiator or photoinitiator system,
- (C) a barrier layer for oxygen, which is transparent for UVA light, and which has a layer thickness of 0.3 µm to 5 µm,
- (D) a laser-ablatable mask layer with a layer thickness of 0.3 µm to 5 µm, comprising at least one elastomeric binder and materials that absorb UV/VIS light, the layer thickness and/or the amount of the light-absorbing materials being made such that the optical density of the layer for UVA radiation is 2 to 5, and
- (E) optionally a removable top film, where both the barrier layer (C) and the laser-ablatable mask layer (D) are water-soluble or water-dispersible.

In a further aspect of the invention, a method for producing flexographic printing plates has been found, by using the stated flexographic printing elements, said method comprising at least the following method steps:
- (0) removing the top film (E) if present,
- (1) writing a mask into the laser-ablatable mask layer (D) by means of an IR laser,
- (2) exposing the imaged flexographic printing element with UVA radiation through the mask formed,
- (3) removing the residues of the laser-ablatable mask layer (D) and the barrier layer (C) using an aqueous washout medium which comprises at least 90 wt % of water,
- (4) removing the unpolymerized fractions of the relief-forming layer (B) using an organic washout medium,
- (5) drying the resulting flexographic printing plate, and
- (6) carrying out aftertreatment with UVA and/or UVC light.

In one preferred embodiment of the method, the flexographic printing element is a flat element and method steps (3) and (4) are carried out using a two-zone washer.

Index to the Figures

FIG. 1 Diagrammatic representation of a two-zone washer

FIG. 2 Microscope images of the flexo plate from comparative example 1

FIG. 3 Microscope images of the flexo plate from inventive example 1

FIG. 4 Microscope images of the flexo plate from inventive example 2

FIG. 5 Microscope images of the flexo plate from inventive example 4

Regarding the invention, the following may be observed in particular:

In the text below, the terms "flexographic printing plate", "flexo plate" or "plate" are used for a print-ready printing form which has already undergone crosslinking. The term "flexographic printing element" is used, conventionally, for the photopolymerizable starting material which is employed for the production of flexographic printing plates or forms.

The flexographic printing elements of the invention comprise at least the following layers disposed one above another: a dimensionally stable support (A), a relief-forming layer (B), a barrier layer (C), and a laser-ablatable mask layer (D). There may of course also be further layers present. Examples include a top film (E) and also tie layers.

The flexographic printing elements of the invention may alternatively be cylindrical flexographic printing elements (sleeves) or plate-form flexographic printing elements.

Dimensionally Stable Support (A)

The flexographic printing element of the invention comprises, in a manner known in principle, a dimensionally stable support. The nature of the support is guided by the nature of the flexographic printing element.

Where the flexographic printing element of the invention comprises a sheetlike structure for producing a flexographic printing plate, the dimensionally stable support (A) comprises, in a manner known in principle, a dimensionally stable support sheet which customarily has a thickness of 50 µm to 300 µm. The material of the support sheet may comprise, for example, steel or aluminum or plastics such as, for example, polyethylene terephthalate, polybutylene terephthalate, polyethylene naphthalate, or polycarbonate. Especially suitable are PET sheets with a thickness of 100 to 200 µm.

Where the flexographic printing elements of the invention are cylindrical plates (sleeves), suitable dimensionally stable supports include not only round polyester sleeves but also glass fiber-reinforced polyester sleeves or other round support materials. The dimensionally stable supports (A) may optionally have been treated with customary adhesion-promoting layers.

Relief-forming Layer (B)

The flexographic printing element further comprises at least one photopolymerizable, relief-forming layer (B) which is dispersible or soluble in organic solvents, and which has a layer thickness of 300 µm to 6000 µm, comprising at least one elastomeric binder, an ethylenically unsaturated monomer, and a photoinitiator or photoinitiator system. Besides the stated components, there may also, optionally, be further components present, such as plasticizers, for example. The elastomeric binders may for example be thermoplastic-elastomeric block copolymers, as for example styrene-butadiene or styrene-isoprene block copolymers, or ethylene-propylene-diene copolymers. Organic solvent-soluble or at least -dispersible compositions for relief-forming layers are known in principle to the skilled person, who selects an appropriate composition according to the desired properties of the flexographic printing plate.

The flexographic printing element of the invention may of course also comprise a plurality of photopolymerizable, relief-forming layers one above another, these layers being dispersible or soluble in organic solvents. Flexographic printing elements having a multilayer construction of the photopolymerizable, relief-forming layer are likewise known to the skilled person.

The polarity of organic solvents can be described in a manner known in principle by means of what is called the solubility parameter (Hansen solubility parameters, J. Appl. Polym. Sci, 5 (15), 339 (1961)). In one preferred embodiment of the invention, the relief-forming layer (B) is a layer which is soluble in organic solvents or solvent mixtures with a solubility parameter <11 $(cal/cm^3)^{1/2}$.

In one particularly preferred embodiment, the relief-forming layer (B) comprises a layer which is soluble in pure hydrocarbons or hydrocarbon mixtures.

The at least one relief-forming layer (B) may be applied directly on the dimensionally stable support (A). Between the relief-forming layer (B) and the dimensionally stable support (A) there may optionally be further layers arranged. Examples include tie or bonding layers, and also compressible and elastic underlayers.

Water-soluble Barrier Layer for Oxygen (C)

Applied on the photopolymerizable, relief-forming layer (B) is a water-soluble or water-dispersible oxygen barrier layer that is transparent for UVA light.

The term "transparent for UVA light" does not of course rule out the possibility that certain fractions of UVA light might be absorbed. What must be ensured, however, is that in the course of the UVA exposure of the flexographic printing element, the polymerization of the relief-forming layer (B) is still possible.

A function of the barrier layer (C) is to prevent the subsequent diffusion of oxygen into the relief-forming layer (B) during the full-area exposure of the flexographic printing element. The oxygen permeability of the barrier layer ought preferably to be less than 100, preferably less than 20 $(cm^3 \times 100\ \mu m)/(m^2 \times d \times bar)$.

The barrier layer (C) comprises at least one water-soluble or water-dispersible binder. Mixtures of two or more different binders may of course also be used. In principle it is possible to use any water-soluble binder with which a low oxygen permeability can be achieved, and with which, more particularly, the oxygen permeability can be below that indicated above. The binder of the barrier layer (C) may be identical to the binder of the mask layer (D), or it may be a different binder.

Digital imaging of the flexographic printing elements of the invention takes place in general using laser apparatus comprising a rotating drum to accommodate the flexographic printing element. Where the flexographic printing element is in plate form, it must be bent when being mounted to the laser drum. Imagewise exposure takes place as a general rule using flatbed exposure units, and so the flexographic printing element must be bent straight again after imaging. In the course of mounting to the drum, the barrier layer (C) must not rupture, and must not form any creases, corrugations or other disruptive structures after being demounted and bent straight.

In one preferred embodiment, the water-soluble or water-dispersible binder in the barrier layer (C) is therefore an elastomeric binder.

Examples of suitable elastomeric binders include polyvinyl alcohols, partly and highly hydrolyzed polyvinyl acetates, especially partly and highly hydrolyzed poly(ethylene oxide-vinyl acetate) graft copolymers, or water-soluble poly(ethylene-vinyl alcohol) copolymers. "Partly hydrolyzed" for the purposes of this invention is an epithet applied to homopolymers and copolymers which comprise vinyl acetate units and in which 40 mol % and 70 mol % of the vinyl acetate units originally present have been hydrolyzed to form vinyl alcohol units. "Highly hydrolyzed" for the purposes of this invention is intended to denote homopolymers and copolymers which comprise vinyl acetate units and in which more than 70 mol % of the vinyl acetate units originally present have undergone hydrolysis to give vinyl alcohol units.

As binders it is possible advantageously to use biodegradable polymers, examples being highly hydrolyzed polyvinyl acetates or polyvinyl acetate copolymers.

In one particularly preferred embodiment of the invention, the binders are polyvinyl acetates having a degree of hydrolysis of 40 mol % to 90 mol %. Polymers of this kind contain both vinyl acetate units and vinyl alcohol units formed from the vinyl acetate units by hydrolysis, and are available commercially with various degrees of hydrolysis. Where the degree of hydrolysis is greater than 90 mol %, the layers are frequently too brittle. Where the degree of hydrolysis is less than 40 mol %, the oxygen barrier effect is generally too low or the layer thickness needed for an adequate barrier effect is too high, thereby reducing the resolution of the flexographic printing elements of the invention.

Besides one or more water-soluble binders, the barrier layer (C) may comprise further components. Examples include plasticizers, stabilizers, dyes—provided they do not excessively lower the transparency in the UV range—or fillers. Through the use of plasticizers it may be possible to improve the elasticity of the barrier layer (C). The amount of fillers, where present, is generally 5 to 20 wt % relative to the sum of all the components of the barrier layer (C).

The thickness of the barrier layer (C) is generally 0.3 $\mu$m to 5 $\mu$m. At layer thicknesses below 0.3 $\mu$m it is difficult to achieve homogeneous, uniform application and a sufficiently uniform barrier effect. At layer thicknesses above 5 $\mu$m, the imaging accuracy may be reduced as a result of increasing scattering effects of the UVA light. The layer thickness is preferably 0.5 $\mu$m to 3 $\mu$m, more preferably 1 $\mu$m to 2. $\mu$m. The layer thicknesses can be measured by means, for example, of microscopic images of a section, or alternatively they may be calculated from the application rate and the density of the material applied.

Water-soluble, Laser-ablatable Layer (D)

Applied on the barrier layer (C) is a water-soluble, laser-ablatable mask layer (D). The information to be printed is written using a suitable laser into the laser-ablatable mask layer (D).

The mask layer (D) comprises at least one water-soluble or water-dispersible elastic binder. Mixtures of two or more different binders may of course also be used.

Examples of suitable water-soluble or water-dispersible binders include partly or highly hydrolyzed polyvinyl esters, examples being partly hydrolyzed polyvinyl acetates, polyvinyl alcohol derivatives, such as partly hydrolyzed vinyl acetate/alkylene oxide graft copolymer, for example, ethylene-vinyl alcohol copolymers, maleic anhydride copolymers such as copolymers of maleic anhydride and isobutene or maleic anhydride and vinyl methyl ether, for example, copolymers of vinyl acetate and crotonic acid, water-soluble polyesters, water-soluble polyethers, homo- and copolymers of vinylpyrrolidone, vinylcaprolactam, vinylimidazole, water-soluble polyacrylamides, water-soluble polyurethanes, water-soluble polyamides, or mixtures of the stated polymers.

With regard to the mechanical properties of the mask layer (D), the requirements that are valid are largely the same as those for the barrier layer (C). Details have already been outlined above. For the mask layer (D), therefore, elastomeric binders are again preferred. Examples of particularly suitable binders include partly or highly hydrolyzed polyvinyl acetates and partly or highly hydrolyzed vinyl acetate/alkylene oxide graft copolymers, ethylene-vinyl alcohol copolymers, or water-soluble polyamides.

Biodegradable polymers can be used advantageously as binders, examples being highly hydrolyzed polyvinyl acetates or polyvinyl acetate copolymers.

The laser-ablatable mask layer (D) comprises not only the binder but also UV/VIS absorbing materials, with the layer thickness and/or the amount of the light-absorbing materials being made such that the optical density of the layer for UVA radiation is 1 to 5. The UVA radiation range encompasses light with a wavelength of 300 nm to 400 nm. The optical density is the logarithmic coefficient for the light intransmissibility of the layer within this wavelength range. When the optical density is measured, therefore, there is no measurement of an individual value for light intransmissibility at a particular wavelength; instead, an average value is found for the light intransmissibilities within a defined wavelength range. Customarily the optical density is measured using commercially available densitometers (e.g., from x-rite), with the wavelength range being selected prior to measurement. For the purposes of the invention, all quoted measurement values for the optical density relate to the UVA range, i.e., to the range from 300 to 400 nm.

Preferred optical densities of the mask layer (D) are in the range from 2 to 5. The high optical density ensures that the regions of the relief-forming layer that are covered by the mask do not undergo polymerization in the course of the full-area exposure to UVA light.

Finely divided carbon black, graphite, or carbon black nanoparticles are especially suitable as light-absorbing material. They absorb very well in the near IR range and accordingly, on exposure with IR lasers, such as IR laser diodes (830 nm) or Nd-YAG lasers (1064 nm), for example, they ensure rapid imaging. However, of course, the laser-ablatable mask layer (D) may also comprise other, pigment-based UV or IR absorbers, or soluble dyes. Examples of dyes which can be used are phthalocyanines and substituted phthalocyanine derivatives, cyanine dyes and merocyanine dyes, or else polymethine dyes or azo dyes.

The amount of the light-absorbing materials is generally 10 wt % to 50 wt % relative to the amount of all the components of the laser-ablatable mask layer.

The laser-ablatable mask layer (D) may optionally further comprise plasticizers, stabilizers, or other auxiliaries, examples being emulsifiers, flow control assistants, or UV absorbers.

When using binders based on polyvinyl alcohol it may be advantageous to stabilize the mask layer by adding suitable plasticizers such as glycols or polyethylene glycols or other polyhydric alcohols. Examples of a highly suitable stabilizer with respect to crosslinking include Xyligen-potassium or the corresponding aluminum salt.

In order to improve the handling qualities of the mask layer (D), it may also be subjected to chemical or physical partial crosslinking. Where polyvinyl alcohol-based binders are used, for example, the finger resistance can be increased by reaction with glyoxal. Partial crosslinking of the layer by means of electron beams may also substantially improve the handling qualities of the layer or its adhesion characteristics.

The thickness of the laser-ablatable mask layer (D) is generally preferably 0.3 μm to 5 μm. At layer thicknesses below 0.3 μm it is difficult to achieve sufficient optical density. At layer thicknesses of more than 5 μm, the laser sensitivity of the element is too low, necessitating long laser times for imaging. The laser sensitivity of the mask layer (measured as the energy needed in order to ablate 1 cm$^2$ of layer) ought to be between 0.5 and 4 mJ/cm$^2$. The layer thickness is preferably 1 μm to 3 μm.

Top Film (E)

As the uppermost layer, the flexographic printing elements of the invention may optionally comprise a removable top film (E), which serves among other things to protect the flexographic printing element. The top film is peeled off before the flexographic printing element is used for producing flexographic printing plates. Particularly suitable removable top films (E) include PET films of moderate or low roughness. Typical Rz values ought to be below 1 μm. For example it is possible to use a Mylar® A PET film.

In the case of flexographic printing elements in plate form, the top film (E) is generally present. In the case of cylindrical flexographic printing elements, the top film (E) is generally not present, i.e., the uppermost layer of cylindrical flexographic printing elements of the invention is the laser-ablatable mask layer (D).

Production of the Flexgraphic Printing Elements of the Invention

The flat flexographic printing elements of the invention are produced, in a manner known in principle, by melting the components of the photopolymerizable layer in an extruder, mixing them, and discharging the melt of the photopolymerizable material through a slot die into the nip of a calender. Over one calender roll there runs a support sheet, optionally coated with further layers, such as with a tie layer, for example, and over the other calender roll there runs a prefabricated top element. The laminate of dimensionally stable support sheet (A), photopolymerizable layer (B), and top film (E) is joined together with the layers (C) and (D) by calendering.

The top element comprises the top film (E), which has already been coated with the laser-ablatable mask layer (D) and the barrier layer (C). In the production of the top element, the laser-ablatable mask layer (D) is first of all applied to the top film (E). This application may take place from solution, from the melt, or by spraying. The laser-ablatable mask layer (D) already joined to the top film (E) is subsequently overcoated with the barrier layer (C).

In order to prevent incipient dissolution of the first, already applied mask layer (D) when being overcoated with the barrier layer, it may be necessary to vary the solvent composition of the casting solutions, or to stabilize the laser-ablatable mask layer (D) before it is overcoated, by crosslinking, to counter damage during overcoating. This can be done, for example, by using polyvinyl alcohol as a binder of the laser-ablatable mask layer (D), and by slightly crosslinking it through addition of glyoxal.

In one alternative embodiment, the mask layer (D) and the barrier layer (C) may also be coated separately each onto a sheet. The mask layer (D) in this case is applied to what is later the top film (E), while the barrier layer (C) is applied to a temporary auxiliary sheet. After coating has taken place, the two sheets are laminated by the layer sides to one another and the temporary auxiliary sheet is removed.

In a further embodiment, the barrier layer (C) may be applied to a temporary auxiliary sheet, introduced into the calender in the above-described extrusion procedure, and joined accordingly to the photopolymerizable layer. Subsequently, the temporary auxiliary sheet is peeled off from the resulting element, with the barrier layer remaining on the photopolymerizable layer. Subsequently a top film coated with the mask layer (D) is laminated on.

Where the flexographic printing elements of the invention are cylindrical flexographic printing elements, the photopolymerizable layer is first of all applied to the cylindrical support, preferably seamlessly. Corresponding procedures are known to the skilled person. Subsequently, to the photopolymerizable layer, the barrier layer (C) and the laser-ablatable mask layer (D) are applied. This can be done, for example, in a manner known in principle by roller coating, annular coating, or spray coating.

Processing of the Flexographic Printing Elements of the Invention into Flexographic Printing Plates The process of the invention for producing flexographic printing plates using the digitally imagable flexographic printing elements described encompasses method steps (1) to (6). The method may of course optionally comprise further method steps as well. If there is a top film (E) present, the top film is removed from the flexographic printing element in a method step (0) which precedes method step (1).

Method Step (1)

In method step (1), in a manner known in principle, a mask is written into the laser-ablatable mask layer (D) by means of an IR laser. Laser apparatus for writing masks is known to the skilled person and is available commercially. In principle it is possible to use all customary market lasers, predominantly external-drum lasers, but also flatbed exposure units.

In one embodiment of the invention, method step (1) can be performed using a laser apparatus comprising a rotatable drum. The plate-form or cylindrical flexographic printing element is mounted to or pulled over the drum, with the support oriented toward the drum, for imaging. Where the flexographic printing element is a plate-form element, it is self-evident that in this case the flexographic printing element is bent and the layers stretch to some extent in this procedure.

Method Step (2)

In method step (2), the imaged flexographic printing element is exposed to UVA radiation through the mask formed, in a manner known in principle. Here, the photopolymerizable layer undergoes polymerization in those regions no longer concealed by the mask, while in the concealed regions there is no polymerization. During exposure, the photopolymerizable layer is protected against the effect of subsequently diffusing oxygen by the barrier layer (C).

Apparatus for exposing plate-form and cylindrical flexographic printing elements is known in principle to the skilled person. The flexographic printing elements can be exposed, for example, with customary market tube exposure units. There is no need for UV-LED high-energy strips to be used, though they can be used at any time. Where the flexographic printing elements of the invention are cylindrical flexographic printing elements, the areal UVA exposure must of course take place in round exposure units.

Method Steps (3) and (4)

In accordance with the invention, the exposed flexographic printing elements are washed out by means of a two-stage procedure comprising method steps (3) and (4).

In a first method step (3), the residues of the laser-ablatable mask layer (D) and also the barrier layer (C) are removed using an aqueous washout medium. The aqueous washout medium comprises at least 80 wt % of water, preferably at least 90 wt %. Besides water there may be water-miscible solvents used, examples being alcohols such as methanol, ethanol, n-propanol, or isopropanol. The aqueous washout medium preferably comprises exclusively water as its solvent. Surfactants, which support the dissolution process, may be added to the water in fractions of customarily 0.1 wt % to 10%.

In a second method step (4), the unpolymerized fractions of the relief-forming layer (B) are removed using an organic washout medium. The organic washout medium comprises at least one organic solvent or organic solvent mixture. It is of course possible to use customary market, commercially available organic flexo washout media. By way of example it is possible to use the organic flexo washout media that are described in EP 332 070 A2.

In one preferred embodiment of the invention, the organic washout medium comprises as its solvents at least 80 wt % of apolar solvents, preferably at least 90 wt %, and with particular preference the washout medium comprises as its solvents exclusively apolar solvents. Suitable apolar solvents preferably have a boiling point of at least 150° C. Examples of suitable apolar solvents include hydrocarbons or hydrocarbon mixtures, or esters. The hydrocarbons may in particular be high-boiling aliphatic, cylcoaliphatic or aromatic hydrocarbon fractions, particularly those having a boiling range of 160 to 220° C.

Particularly preferred are hydrocarbon solvents having a boiling range within the range from 160 to 220° C. that comprise paraffinic and naphthenic hydrocarbons (for example, Exxsol® D 60). Hydrocarbon solvents of this kind are odorless, can easily be regenerated by distillation, and have a composition which does not change substantially during the washing operation. For safety reasons, an antistat ought to be added to the hydrocarbon solvent. Corresponding additives are known to the skilled person.

Washout in one embodiment of the invention can take place using commercially customary washout equipment. Washout equipment for washing out plate-form or cylindrical exposed flexographic printing elements is known in principle to the skilled person. Where the flexographic printing elements of the invention are plate-form flexographic printing elements (production of flexographic printing plates), washout is performed preferably in flat washers. Where the flexographic printing elements of the invention are cylindrical flexographic printing elements (for producing sleeves), washout takes place in round washers.

In a first washout unit, method step (3) is carried out using the aqueous washout media described, and in a second unit method step (4) is carried out using the organic washout media described.

It is advisable here to carry out interim drying of the flexographic printing element after method step (3) has been carried out, in order to remove any adhering residues of the aqueous washout medium and so to prevent contamination of the organic washout media of the method step (4), since otherwise there may be problems with foams or with soiling of the washer. It is worth recommending here for both the facing side and the underside of the flexographic printing element to be freed thoroughly from all traces of water. Residues of aqueous washout media can be removed using, for example, conventional air-circulation dryers. IR or microwave emitters, or by blowing with compressed air from individual nozzles or a continuous air knife. Since the relief-forming layer is organic-soluble, it cannot swell in water.

In the case of plate-form flexographic printing elements, method steps (3) and (4) may be carried out advantageously using a single washout unit with two washing zones, referred to as a two-zone washer.

The two-zone washer comprises at least one first wash unit (W1), an interim drying unit (Z), and a second wash unit (W2), which are each connected to one another by transport devices (T) for transporting the flexographic printing elements from one unit to the next. The wash unit (W1) serves for implementation of method step (3), i.e., for washing out the exposed flexographic printing elements with aqueous washout media, and the wash unit (W2) serves for implementation of method step (4), i.e., for washing out the exposed flexographic printing elements with organic washout media.

The two wash units (W1) and (W2) are in each case flatbed washers, these being wash units in which the plate-form flexographic printing element is processed in a planar state. The flexographic printing elements for processing are inserted into the two-zone washer with the underside—that is, with the dimensionally stable support—oriented downward. The transport of the flexographic printing elements through the two-zone washer may take place by means of spindles or chains, which are disposed on either side of the wash units (W1) and (W2) and of the interim drying unit (Z), and into which the flexographic printing elements are suspended, for example, by means of a transport strip. A chain drive has the advantage that the flexographic printing elements need not necessarily be transported horizontally. For example, flexographic printing element can be introduced at a slight gradient into the washout zones, and can be guided out at the end by means of a slight upward slope. The entrainment of washout media outside of the unit is prevented in this way.

The purpose of the interim drying unit (Z) is to prevent traces of water from the first wash unit (W1) entering the second washing zone, since otherwise there may be problems with foams or soiling of the washer. Possible drying technologies have already been mentioned.

For mechanical assistance of the washout operations in the wash units (W1) and (W2), the flatbed washers may comprise, in a manner known in principle, various brushes or plush rollers. Washing out may alternatively take place contactlessly, by simple rinsing off or spraying with water; for wash unit (W2), simple rinsing off is generally not advisable. Brushes contemplated include round brushes, pot brushes, conical brushes or roller brushes. The brushes, rollers, or spraying heads may perform circular motions or oscillate over the width of the plates. Support for the dissolving procedure through application of ultrasound is also possible. At the end of the washing zones it may be necessary for the facing side and underside of the flexographic printing elements to be cleaned again with neat washout medium.

The wastewater from the first washing zone (W1) may optionally be collected in a tank and circulated until the maximum solids fraction is reached. The solids fraction ought not to exceed 5 wt %. If the wash water is circulated, it is advisable to install a filter in order to remove dispersed substances. The temperature of the water can be regulated by thermostats. It ought to be regulated within a range between 15° C. and 40° C.

FIG. 1 shows diagrammatically one embodiment of a two-zone washer, comprising a first washing zone (W1), an interim drying zone (Z), and a second washing zone (W2), Washing zone (W1) comprises round brushes (1) for removing the laser-ablatable mask layer and the barrier layer. Division of the washing zone (W1) from the interim drying zone (Z) may be accomplished by means of barrier brushes (2) arranged above and below the plate. Interim drying takes place with air knives (3). The second washing zone (W2) comprises round brushes (4) for washing out the relief layer. At the end of the second washing zones, there may be additional washing brushes (5) for aftercleaning with fresh solvent. The flexographic printing elements (6) are transported through the two-zone washer by means of the transport unit (T) (not shown in the drawing).

Method Steps (5) and (6)

In method step (5), the resulting flexographic printing plate is dried in a manner known in principle, and in method step (6), in a manner known in principle, it is aftertreated with UVA and/or UVC light.

Advantages of the flexographic printing elements of the invention and of the method of the invention:

The flexographic printing elements of the invention allow the imagewise transfer of ultrafine structures. The mask layer can be imaged with a variety of lasers. Highly suitable are diode lasers which emit in the region of 830 nm or 900 nm, or else fiber lasers which emit at 1064 nm. The mask layer can be imaged with a resolution of 2000 dpi up to 10 000 dpi. As a result, the surfaces of the image elements of the flexographic printing plates can be structured virtually ad infinitum, in order to optimize the printing behavior in accordance with the required application.

Surface structures for increasing ink transfer or for more uniform transfer of the ink film in flexographic printing are known to the skilled person. The following screens available from Esko, for example, are highly suitable: HD Flexo Screen MG 25, MG 2×3 and MC WSI. In this case the individual laser spots are switched on and off periodically, thus generating fine structures such as regular dots, lines, or other geometric structures on the surface of the flexo plates. The dimensions of these surface structures (<20 µm) are smaller than the size of a typical halftone dot, meaning that not only areal image elements but also the surface of individual halftone dots can be provided with a fine structure.

Alternatively, the flexographic printing elements of the invention can also be used to produce surface structures analogously. Where the barrier layer (C), for example, comprises fillers in the µm or sub-µm range, a rough surface is formed. During areal UVA exposure, this surface structure can be transferred onto the relief-forming layer. In order to optimize the ink transfer properties of the flexographic printing elements of the invention, therefore, it may be necessary to produce barrier layers with controlled roughness for certain printing applications. As an alternative to washout, the flexographic printing elements of the invention may also be developed thermally, in which case the drying step is omitted. Washout by means of a two-stage method does require one extra method step as compared with one-stage washout. With the two-stage operation, however, there are a range of other advantages associated, which go a long way to compensating the disadvantages.

Since the mask layer is removed separately in a first step, there is no contamination of the organic washout media in the second washing step. Furthermore, one washout medium, comprising only hydrocarbons, is sufficient to wash out the relief-forming layer in the second washout step. There is no need for any moderately polar alcohols (which usually have an unpleasant odor) for the organic washout solution. Reprocessing of the organic washout media is therefore very much easier than in the case of multicomponent washout media with additional contamination from carbon black.

Furthermore, for the barrier layer (C) and for the mask layer (D), it is possible to use biodegradable, water-soluble polymers, such as partly or highly hydrolyzed polyvinyl acetates or polyvinyl acetate copolymers, for example. The wastewater from the first washing zone can therefore be admitted directly into the wastewater, without any need for aftertreatment.

The invention is described in more detail in the examples below.

COMPARATIVE EXAMPLE 1

Photopolymerizable layer: soluble in organic washout media

Barrier layer for oxygen: —

Laser-ablatable mask layer: soluble in organic washout media

A commercial, digitally imagable flexographic printing element, having an organically developable photopolymerizable layer and also a laser-ablatable mask layer likewise removable in organic washout media, was used (nyloflex®

ACE 114 D). The flexographic printing element does not have an oxygen barrier layer. The coatweight of the mask layer is 2.6 g/m², the optical density of the mask layer in the UVA range, measured using a Macbeth® TD 904 densitometer, is 4.1.

The flexographic printing element was first subjected to preliminary reverse exposure for ten seconds. The top film was removed. Following preliminary exposure, a test motif was written into the mask layer of the flexographic printing element using an IR laser. Owing to the remaining mask layer, the nonimage regions here remain UV-impermeable, while, as a result of the removal of the mask in the image regions, the curing of the photopolymerizable relief layer by means of actinic radiation is enabled. Imaging of the digital mask was performed using a CDI Spark 4835 ablation laser system from Esko, the mask resolution used being 4000 dpi and the laser being fitted with a high-resolution optical option (Pixel+). HD Flexo 2.0 from EskoArtwork was used as RIP software. The test motif contained a halftone wedge with tonal values of 1% to 99% at a resolution of 47 L/cm, and also various full-area elements with and without surface structure. The MG 25 and MC WSI screens were used as surface structures. The laser energy was determined via tonal value measurements with a Peret Flex³ Pro densitometer from X-Rite, by considering the ablation result of the 40% tonal value at different energies for different laser powers. Where the measured tonal value corresponded to the original, the total test motif was imaged at this energy. The flexographic printing element described here was subsequently mounted to the laser drum and imaged with the ascertained energy of 3.2 J/cm².

The flexographic printing element prepared accordingly was then exposed for 14 minutes to UVA radiation through the mask formed (nyloflex® F. III exposure unit, Flint Group).

The flexographic printing element was subsequently washed out using a commercial organic washout medium (nylosolv® A) composed of about 70 wt % of hydrocarbons and about 30 wt % of an alcohol (washout speed 240 mm/min, nyloflex® F III washer). In this case both the residues of the mask layer and the non-photopolymerized fractions of the relief-forming layer were removed.

Following the washout operation, in accordance with the product-specific recommendations, the plates, which still contained solvent, were dried at 60 to 65° C. for 90 minutes and then afterexposed in the afterexposure unit of a nyloflex® F III exposure unit with UVA and UVC light. The purposes of the afterexposure are first to convert still-reactive residual quantities of monomer and photoinitiator, and second to make the plate surface less tacky.

Evaluation of the plate revealed that in general primarily rounded halftone dots can be observed (see FIG. 2a). Low halftone tonal values can no longer be imaged at all on the plate. At a halftone width of 47 L/cm, the smallest imaged halftone tonal value is 4.3%. Surface halftones cannot be transferred to the plate from the imaging, and are only roughly visible (see FIG. 2b).

COMPARATIVE EXAMPLE 2

Photopolymerizable layer: soluble in organic washout media
Barrier layer for oxygen; —
Laser-ablatable mask layer: water-soluble
The digital mask layer was produced as follows:
100 kg of water were admixed with 23 kg of Levanyl® Black A-SF and briefly stirred. Then 40.0 kg of 20% strength Alcotex® 97-5 solution (partially hydrolyzed polyethylene oxide-polyvinyl acetate graft copolymer with a degree of hydrolysis of 97 mol %, solvent composition 80% water/ 20% propanol) were added and the mixture was stirred for 5 minutes. This mixture was subsequently admixed with 29 kg of n-propanol, and again stirred for 10 minutes. Lastly 0.08 kg of Capstone® FS-30 was added as flow control assistant, and the mixture was stirred for around 10 minutes at about 600 revolutions per minute. Following this, the reaction solution was stirred further very slowly overnight. After that the solution was applied with a wet thickness of 145 µm at a speed of 6.0 m/min to a Mylar® PET film 100 µm thick.

The coatweight of the mask layer, obtained via gravimetric measurements, is 2.8 g/m²; the optical density of the mask layer in the UVA range, measured using a Macbeth® TD 904 densitometer, is 4.1.

To start with, the top film and the thin release layer were removed from a commercial, organically developable flexographic printing element (nyloflex® ACE 114; the photopolymerizable layer is the same as for comparative example 1, but the flexographic printing element present has no digitally imagable mask layer). Subsequently the film element described was laminated with the mask layer onto the photopolymerizable surface, using a laminator. The temperature of the laminating rolls was set to 110° C. The assembly of base film, photopolymerizable layer, mask layer, and top film was heated further at 65° C. for 3 hours.

The flexographic printing element was first of all preexposed from the reverse for 10 seconds. The top film was removed. The flexographic printing element which had undergone preliminary reverse exposure was applied to the rotatable drum of an IR laser (CDI Spark 4835 laser, Eska). The laser energy needed for exposure was determined as in comparative example 1. It was found to be 2.2 J/cm². The test motif was then written into the mask layer using the IR laser.

The imaged flexographic printing element was subsequently exposed to UVA radiation for 14 minutes in analogy to comparative experiment 1.

Washout took place in two steps.

First of all, the residues of the laser-ablatable mask layer were washed off with water in a first washout step, and water still adhering was removed by being blown off with compressed air.

Subsequently, in a second washout step, the relief-forming layer was developed using an organic washout medium (washout speed 240 mm/min, nyloflex® F III washer). The washout medium used was a technical mixture of aromatic-free hydrocarbons having a boiling range of about 180 to 220° C. (Exxsol® D 60).

The printing plate was thereafter processed as described in comparative example 1. Evaluation of the plate revealed that in general primarily rounded halftone dots can be observed. Low halftone tonal values can no longer be imaged on the plate at all. Ada halftone width of 47 L/cm, the smallest imaged halftone tonal value is 4.3%. Surface halftones cannot be transferred to the plate from the imaging, and are again visible only roughly on the surface.

17

INVENTIVE EXAMPLE 1

Photopolymerizable layer: soluble in organic washout media

Barrier layer for oxygen: water-soluble

Laser-ablatable mask layer: water-soluble

The water-developable mask layer was obtained as described in comparative example 2 and applied as described to a PET film. The coatweight was 2.8 g/m², The optical density in the UVA range, measured using a Macbeth® TD 904 densitometer, was 4.1.

The water-developable barrier layer was obtained as follows:

3 parts of a partly hydrolyzed polyvinyl acetate copolymer (Alcotex® 72.5, degree of hydrolysis about 72 mol %) were added to 97 parts of a solvent mixture of water and n-propanol in a ratio of 1:1 with stirring. The resulting dispersion was subsequently heated under reflux at 80° C. for 2 hours. Thereafter the coating solution, after cooling to room temperature, was knife-coated at a speed of 33.7 mm/s and with a wet thickness of 75 µm onto a PET film 100 µm thick. The coatweight was 1.5 g/m², as obtained via gravimetric measurements.

To start with, the top film and the thin release layer were removed from a commercial, organically developable flexographic printing element (nyloflex° ACE 114). Subsequently the film element described was laminated with the barrier layer onto the photopolymerizable surface, using a laminator. Subsequently the PET film was removed and the water-developable, wash-removable mask layer was laminated onto the barrier layer. The assembly was heated at 65° C. for 3 hours.

The resulting flexographic printing element was first of all pre-exposed from the reverse for 10 seconds. The top film was removed. The flexographic printing element which had undergone preliminary reverse exposure was applied to the rotatable drum of an IR laser (CDI Spark 4835 laser, Esko). The laser energy needed for exposure was determined as in comparative example 1. It was found to be 2.2 J/cm². The test motif was then written into the mask layer using the IR laser.

The imaged flexographic printing element was subsequently exposed to UVA radiation for 14 minutes in analogy to comparative experiment 1.

Washout took place in two steps.

First of all, the residues of the laser-ablatable mask layer and also the oxygen barrier layer were washed off with water in a first washout step, and water still adhering was removed by being blown off with compressed air.

Subsequently, in a second washout step, the relief-forming layer was developed using an organic washout medium (washout speed 240 mm/min, nyloflex® F III washer). The washout medium used, as in comparative example 2, was a technical mixture of aromatic-free hydrocarbons having a boiling range of about 180 to 220° C. (Exxsol® D 60).

The printing plate was thereafter processed as described in comparative example 1. Evaluation of the plate revealed that sharp-edged halftone dots are present on the plate (see FIG. 3a). Even low halftone tonal values can be imaged on the plate. Ada halftone width of 47 L/cm, the smallest stably imaged halftone tonal value is 0.8%. Surface halftones can be transferred with accurate detail to the plate from the imaging (see FIG. 3b).

18

INVENTIVE EXAMPLE 2

Photopolymerizable layer: soluble in organic washout media

Barrier layer for oxygen: water-soluble

Laser-ablatable mask layer: water-soluble

The water-developable mask layer was produced as follows:

The coating solution described in comparative example 2 was applied with a wet thickness of 125 µm at a speed of 6.8 m/min to the Mylar® PET film 100 µm thick. The coatweight was 2.0 g/m², having been obtained via gravimetric measurements; the optical density in the UVA range, measured using a Macbeth® TD 904 densitometer, was 3.5.

The water-developable barrier layer was produced as in inventive example 1.

The coatweight was 1.5 g/m², as obtained via gravimetric measurements.

To start with, the top film and the thin release layer were removed from a commercial, organically developable flexographic printing element (nyloflex® ACE 114). Subsequently the film element described was laminated with the barrier layer onto the photopolymerizable surface, using a laminator. Subsequently the PET film was removed and the water-developable, wash-removable mask layer was laminated onto the barrier layer. The assembly was heated at 65° C. for 3 hours.

The flexographic printing element was first of all pre-exposed from the reverse for 10 seconds. The top film was removed. The flexographic printing element which had undergone preliminary reverse exposure was applied to the rotatable drum of an IR laser (CDI Spark 4835 laser, Esko). The laser energy needed for exposure was determined as in comparative example 1. It was found to be 1.7 J/cm². The test motif was then written into the mask layer using the IR laser.

The imaged flexographic printing element was subsequently exposed to UVA radiation for 14 minutes in analogy to comparative experiment 1.

Washout took place in two steps.

First of all, the residues of the laser-ablatable mask layer and also the oxygen barrier layer were washed off with water in a first washout step, and water still adhering was removed by being blown off with compressed air.

Subsequently, in a second washout step, the relief-forming layer was developed using an organic washout medium (washout speed 240 mm/min, nyloflex® F III washer). The washout medium used, as in comparative example 2, was a technical mixture of aromatic-free hydrocarbons having a boiling range of about 180 to 220° C. (Exxsol D 60), The printing plate was thereafter processed as described in comparative example 1. Evaluation of the plate revealed that sharp-edged halftone dots are present on the plate. Even low halftone tonal values can be imaged on the plate. At a halftone width of 47 L/cm, the smallest stably imaged halftone tonal value is 0.8%. Surface halftones can be transferred with accurate detail to the plate from the imaging (see FIG. 4).

INVENTIVE EXAMPLE 3

Photopolymerizable layer: soluble in organic washout media

Barrier layer for oxygen: water-soluble, contains fillers

Laser-ablatable mask layer: water-soluble

The water-developable mask layer was produced as in inventive example 2. The coatweight was 2.0 g/m². The optical density in the UVA range, measured using a Macbeth® TD 904 densitometer, was 3.5.

The water-developable barrier layer was produced in the same way as for inventive example 1. Prior to the heating of the solution, the coating solution was additionally admixed with 0.2 part by weight (based on the amount of polyvinyl alcohol used) of a finely divided inorganic silicate (Syloid® ED30, average particle size 5.5 µm) as filler. This gave a milky dispersion, which was subsequently knife-coated as described in inventive example 1 onto a PET film 100 µm thick. The coatweight was 1.5 g/m².

To start with, the top film and the thin release layer were removed from a commercial, organically developable flexographic printing element (nyloflex® ACE 114). Subsequently the film element described was laminated with the barrier layer onto the photopolymerizable surface, using a laminator. Subsequently the PET film was removed and the water-developable, wash-removable mask layer was laminated onto the barrier layer. The assembly was heated at 65° C. for 3 hours.

The flexographic printing element was first of all pre-exposed from the reverse for 10 seconds. The top film was removed. The flexographic printing element which had undergone preliminary reverse exposure was applied to the rotatable drum of an IR laser (CDI Spark 4835 laser, Esko). The laser energy needed for exposure was determined as in comparative example 1. It was found to be 1.7 J/cm². The test motif was then written into the mask layer using the IR laser.

The imaged flexographic printing element was subsequently exposed to UVA radiation for 14 minutes in analogy to comparative experiment 1.

Washout took place in two steps. First of all, the residues of the laser-ablatable mask layer and also the oxygen barrier layer were washed off with water in a first washout step, and water still adhering was removed by being blown off with compressed air. Subsequently, in a second washout step, the relief-forming layer was developed using an organic washout medium (washout speed 240 mm/min, nyloflex® F III washer). The washout medium used, as in comparative example 2, was a technical mixture of aromatic-free hydrocarbons having a boiling range of about 180 to 220° C. (Exxsol® D 60). Thereafter the printing plate was processed as described in comparative example 1.

Evaluation of the plate revealed that sharp-edged halftone dots are present on the plate. Even low halftone tonal values can be imaged on the plate. At a halftone width of 47 L/cm, the smallest stably imaged halftone tonal value is 0.8%. Surface halftones can be transferred with accurate detail to the plate from the imaging. Furthermore, the geometry of the surface of the barrier layer (see FIG. 5a) can be transferred exactly onto the surface of the plate (see FIG. 5b).

The experiments demonstrate that the flexographic printing elements of the invention possess high resolution, are able to image ultrafine surface structures, can be laser-imaged with low energy, and can be processed quickly and easily to give the plate.

The invention claimed is:

1. A method for producing flexographic printing plates, by using as starting material a digitally imagable, photopolymerizable flexographic printing element, comprising at least—arranged one above another in the order stated—
   (A) a dimensionally stable support,
   (B) at least one photopolymerizable relief-forming layer which is dispersible or soluble in organic solvents and has a layer thickness of 300 µm to 6000 µm, comprising at least one elastomeric binder, an ethylenically unsaturated monomer, and a photoinitiator or photoinitiator system,
   (C) a barrier layer for oxygen, which is transparent for UVA light, and which has a layer thickness of 0.3 µm to 5 µm,
   (D) a laser-ablatable mask layer with a layer thickness of 0.3 µm to 5 µm comprising at least one elastomeric binder and materials that absorb UV/VIS light, the layer thickness and/or the amount of the light-absorbing materials being made such that the optical density of the layer for UVA radiation is 2 to 5, and
   (E) optionally a removable top film,
   where both the barrier layer (C) and the laser-ablatable mask layer (D) are water-soluble or water-dispersible, comprising the following method steps:
   (0) removing the top film (E) if present,
   (1) writing a mask into the laser-ablatable mask layer (D) by means of an IR laser,
   (2) exposing the imaged flexographic printing element with UVA radiation through the mask formed,
   (3) removing residues of the laser-ablatable mask layer (D) and the barrier layer (C) using an aqueous washout medium which comprises at least 90 wt % of water,
   (4) removing unpolymerized fractions of the relief-forming layer (B) using an organic washout medium to make a resulting flexographic printing plate,
   (5) drying the resulting flexographic printing plate, and carrying out aftertreatment with UVA and/or UVC light.

2. The method as claimed in claim 1, wherein the barrier layer (C) comprises at least one water-soluble or water-dispersible binder.

3. The method claim 2, wherein the water-soluble or water-dispersible binder in the barrier layer (C) comprises at least one binder selected from the group of polyvinyl alcohol, partly and highly hydrolyzed polyvinyl acetates, partly and highly hydrolyzed poly(ethylene oxide-vinyl acetate) graft copolymers, or water-soluble poly(ethylene-vinyl alcohol) copolymers.

4. The method as claimed in claim 2, wherein the water-soluble or water-dispersible binder in the barrier layer (C) comprises at least one polyvinyl acetate having a degree of hydrolysis of 40 mol % to 90 mol %.

5. The method as claimed in claim 1, wherein the barrier layer (C) comprises fillers in an amount of 5 to 20 wt % relative to the sum of all the components of the barrier layer (C).

6. The method as claimed in claim 1, wherein the elastomeric binder in the laser-ablatable mask layer (D) comprises at least one selected from the group of partly or highly hydrolyzed polyvinyl esters, partly hydrolyzed vinyl acetate/alkylene oxide graft copolymers, ethylene-vinyl alcohol copolymers, maleic anhydride copolymers, copolymers of vinyl acetate and crotonic acid, water-soluble polyesters, water-soluble polyethers, homo- and copolymers of vinylpyrrolidone, vinylcaprolactam, vinylimidazole, water-soluble polyacrylamides, water-soluble polyurethanes, or water-soluble polyamides.

7. The method as claimed in claim 1, wherein the elastomeric binder in the laser-ablatable mask layer (D) comprises at least one selected from the group of partly or highly hydrolyzed polyvinyl acetates, partly or highly hydrolyzed vinyl acetate-alkylene oxide graft copolymers, ethylene-vinyl alcohol copolymers, or water-soluble polyamides.

8. The method as claimed in claim 1, wherein the light-absorbing material in the laser-ablatable mask layer (D) comprises at least one selected from the group of finely divided carbon black, graphite, or carbon black nanoparticles.

9. The method as claimed in claim 1, wherein the amount of the light-absorbing materials in the laser-ablatable mask layer (D) is 10 wt % to 50 wt % relative to the amount of all the components of the laser-ablatable mask layer.

10. The method as claimed in claim 1, wherein the flexographic printing plate is a flat flexographic printing element.

11. The method as claimed in claim 1, wherein the flexographic printing plate is a cylindrical flexographic printing element with the proviso that there is no top film (E) present.

12. The method as claimed in claim 1, wherein the aqueous washout medium in method step (3) comprises water.

13. The method as claimed in claim 1, wherein the at least one elastomeric binder in the laser-ablatable mask layer (D) comprise biodegradable binders, and spent aqueous washout medium is passed into a wastewater.

14. The method as claimed in claim 1, wherein residues of the aqueous washout medium still adhering to the flexographic printing element are removed between method steps (3) and (4).

15. The method as claimed in claim 1, wherein the organic washout medium used in method step (4) comprises an apolar solvent having a boiling point of at least 150° C.

16. The method as claimed in claim 1, wherein the organic washout medium used in method step (4) comprises a hydrocarbon solvent which comprises paraffinic and naphthenic hydrocarbons and has a boiling range of 160 to 220° C.

17. The method as claimed in claim 16, wherein the washout medium comprises only hydrocarbons.

18. The method as claimed in claim 1, wherein a flat flexographic printing element is processed and method steps (3) and (4) are carried out using a two-zone washer to wash out exposed, digitally imaged flat flexographic printing elements, comprising at least a first washout unit (W1) which operates using aqueous washout media, an interim drying unit (Z) for removing residues of aqueous washout media from the flexographic printing element, a second washout unit (W2) which operates using organic washout media, and a transport device (T) for transporting the exposed flexographic printing elements through the units (W1), (Z), and (W2).

* * * * *